(12) United States Patent
Li

(10) Patent No.: US 12,712,532 B2
(45) Date of Patent: Aug. 18, 2026

(54) SINGLE-TO-DIFFERENTIAL CIRCUIT AND METHOD FOR OPERATING THE SAME

(71) Applicant: TAIWAN SEMICONDUCTOR MANUFACTURING COMPANY LTD., Hsinchu (TW)

(72) Inventor: Chang-Yi Li, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 2 days.

(21) Appl. No.: 18/786,608

(22) Filed: Jul. 29, 2024

(65) Prior Publication Data

US 2026/0031797 A1 Jan. 29, 2026

(51) Int. Cl.
*H03K 3/037* (2006.01)

(52) U.S. Cl.
CPC .................................... *H03K 3/037* (2013.01)

(58) Field of Classification Search
CPC ...................................................... H03K 3/037
USPC ................................ 327/208, 210, 211, 212
See application file for complete search history.

(56) References Cited

U.S. PATENT DOCUMENTS

2008/0054944 A1* 3/2008 Kwon .................. H03K 19/094
326/83

* cited by examiner

*Primary Examiner* — Regis J Betsch
*Assistant Examiner* — Amit R Bhatia
(74) *Attorney, Agent, or Firm* — WPAT LAW; Anthony King

(57) ABSTRACT

The present disclosure provides an integrated circuit, which includes an input stage, a first output stage, and a second output stage. The input stage receives and converts an input clock signal into a first signal and a second signal. The first output stage includes a first inverter and a first buffer circuit. The first inverter and the first buffer circuit receive the second signal and the first signal, respectively, and generate a first output clock signal at a first output terminal of the integrated circuit. The second output stage includes a second inverter and a second buffer circuit. The second inverter and the second buffer circuit receive the first signal and the second signal, respectively, and generate a second output clock signal at a second output terminal of the integrated circuit. The first output clock signal and the second output clock signal are differential clock signals.

20 Claims, 9 Drawing Sheets

SINGLE-TO-DIFFERENTIAL CIRCUIT AND METHOD FOR OPERATING THE SAME

BACKGROUND

The semiconductor integrated circuit (IC) industry has grown rapidly due to advancements in IC materials and design. Each new generation of ICs features smaller and more complex circuits than the previous one. Single-to-differential circuits are often used in integrated circuits for high-speed applications. However, it is challenging to design a single-to-differential circuit with high accuracy in a small layout area.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1:
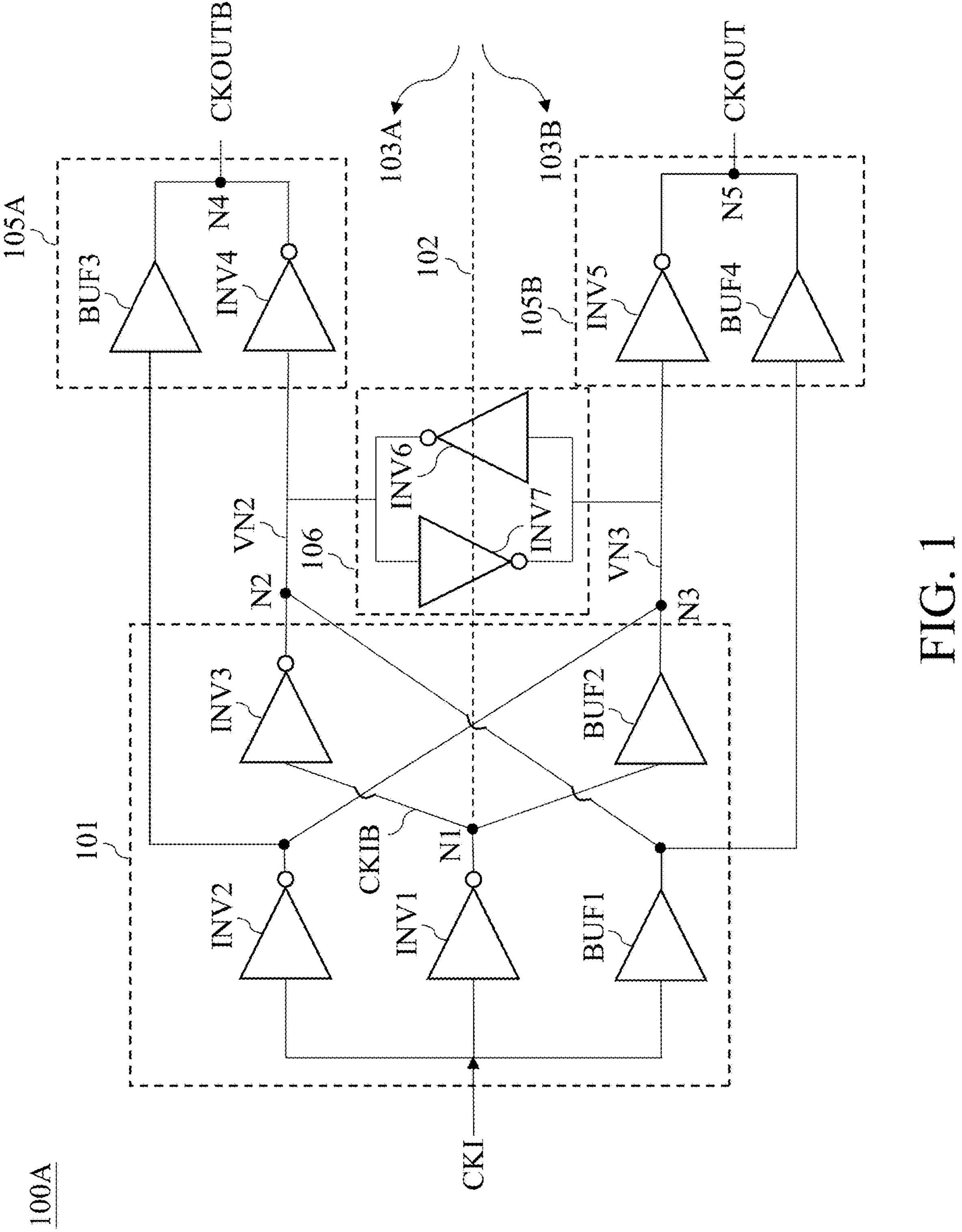
FIG. 1 is a block diagram of a single-to-differential circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

In some embodiments, a single-to-differential (S2D) circuit is provided to convert an input clock signal into differential output clock signals. The S2D circuit employs buffer circuits to improve the driving capabilities of inverters within multiple inverter stages, thereby reducing the rising time and falling time of the differential output clock signals.

FIG. 1 is a block diagram of a single-to-differential circuit in accordance with some embodiments of the present disclosure.

In some embodiments, the single-to-differential (abbreviated as "S2D") circuit 100A is configured to convert an input clock signal CKI to a differential output clock signal including a first output clock signal CKOUT and a second output clock signal CKOUTB that are differential clock signals. The first output clock signal CKOUT and the second output clock signal CKOUTB are in-phase and out-phase clock signals with respect to the input clock signal CKI, respectively. For example, the phase of the first output clock signal CKOUT may be substantially equal to the input clock signal CKI, while the phase of the second output clock signal CKOUTB may be complementary to that of the first output clock signal CKOUT.

In some embodiments, the S2D circuit 100A includes a plurality of inverters INV1 to INV7 and a plurality of buffer circuits BUF1 to BUF4, as depicted in FIG. 1. The inverters INV1 to INV3 and buffer circuits BUF1 to BUF2 can constitute an input stage 101. The inverter INV4 and buffer circuit BUF3 can constitute an output stage 105A for the second output clock signal CKOUTB. The inverter INV5 and buffer circuit BUF4 can constitute an output stage 105B for the first output clock signal CKOUT. Additionally, the inverters INVI and INV3 can constitute a first inverter stage, while the inverter INV2 can constitute a second inverter stage.

For example, the input clock signal CKI is provided to the input terminals of the inverters INV1 and INV2 and buffer circuit BUF1. The output terminal (e.g., node N3) of the inverter INV2 is connected to the output terminal of the buffer circuit BUF2 and inverter INV7, and the input terminals of the inverters INV5 and INV6 and the buffer circuit BUF3. Additionally, the output terminal (e.g., node N2) of the buffer circuit BUF1 is connected to the output terminal of the inverters INV3 and INV6, and the input terminals of the inverters INV4 and INV7 and the buffer circuit BUF4. The inverters INV6 and INV7 may form a latch 106 which is coupled between nodes N2 and N3. Furthermore, the output terminals of the inverter INV5 and the buffer circuit BUF4 are connected to output the first output clock signal CKOUT, while the output terminals of the inverter INV4 and the buffer circuit BUF3 are connected to output the second output clock signal CKOUTB.

In some embodiments, the buffer circuits BUF1 to BUF4 may be configured to improve the driving capability of the output voltage signals of the inverters INV2 to INV7 generated at their output terminals, thereby reducing the rising time and falling time of the output voltage signals generated at their output terminals. The details thereof will be described later.

Figure 2B:
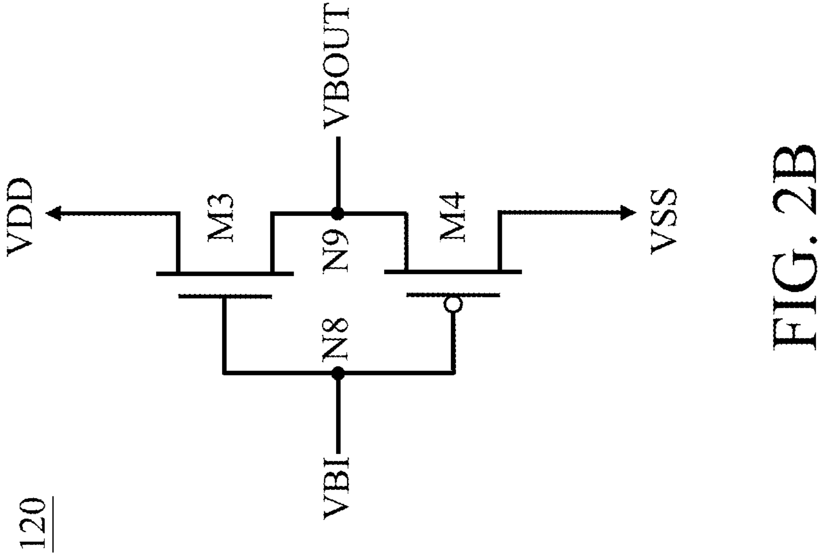
FIG. 2B is a circuit diagram of the buffer circuit in FIG. 1.
Figure 2A:
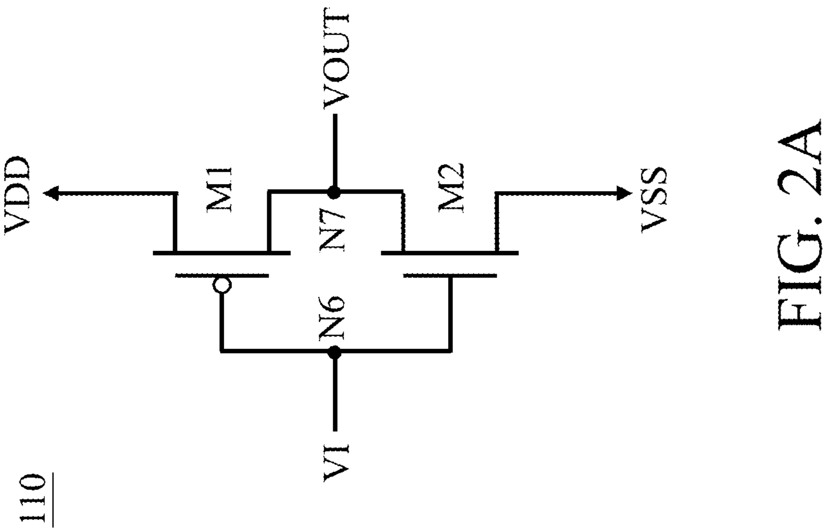
FIG. 2A is a circuit diagram of the inverter in FIG. 1.

FIG. 2A is a circuit diagram of the inverter in FIG. 1. In some embodiments, each of the inverters INV1 to INV7 shown in FIG. 1 may be implemented using the inverter 110 shown in FIG. 2A. As depicted in FIG. 2A, the inverter 110 includes transistors M1 and M2. The transistor M1, such as a P-type transistor, includes a gate terminal (e.g., node N6) receiving an input voltage signal VI, a source terminal coupled to a power supply voltage VDD, and a drain terminal coupled to the output terminal (e.g., node N7) of the inverter 110, while the transistor M2, such as a N-type transistor, includes a gate terminal (e.g., node N6) receiving the input voltage signal VI, a source terminal connected to the reference voltage VSS (or ground voltage), a drain terminal connected to the output terminal (e.g., node N7) of the inverter 110. When the input voltage signal VI is in a high logic state (e.g., "1"), transistor M2 is turned on, and transistor M1 is turned off, pulling down the output voltage VOUT at node N7 to the reference voltage VSS. When the input voltage signal VI is in a low logic state (e.g., "0"), transistor M1 is turned on, and transistor M1 is turned off, pulling up the output voltage VOUT at node N7 to the power supply voltage VDD. It should be noted that the voltage swing range of the inverter 110 is between the power supply voltage VDD and the reference voltage VSS.

FIG. 2B is a circuit diagram of the buffer circuit in FIG. 1. In some embodiments, each of the buffer circuits BUF1 to BUF4 shown in FIG. 1 may be implemented using a logic buffer 120 shown in FIG. 2B. As depicted in FIG. 2B, the buffer circuit 120 includes transistors M3 and M4. The transistor M3, such as a N-type transistor, includes a gate terminal (e.g., node N8) receiving an input voltage signal VBI, a source terminal coupled to the output terminal (e.g., node N9) of the buffer circuit 120, and a drain terminal coupled to the power supply voltage VDD, while the transistor M4, such as a P-type transistor, includes a gate terminal (e.g., node N8) receiving the input voltage signal VBI, a source terminal coupled to the output terminal (e.g., node N9) of the buffer circuit 120, a drain terminal connected to the reference voltage VSS (or ground voltage). When the input voltage signal VBI is in a high logic state (e.g., "1"), transistor M3 is turned on, and transistor M4 is turned off, pulling up the output voltage VBOUT at node N9 to the power supply voltage. When the input voltage signal VBI is in a low logic state (e.g., "0"), transistor M4 is turned on, and transistor M3 is turned off, pulling down the output voltage VBOUT at node N9 to the reference voltage VSS. It should be noted that the voltage swing range of the output voltage VBOUT at node N9 is between the (VDD-Vtn) and (VSS+|Vtp|), where Vtn and Vtp denote the threshold voltages of the transistors M3 and M4, respectively. Additionally, the threshold voltage Vtn is a positive value, while the threshold voltage Vtp is a negative value.

Attention now is directed back to FIG. 1. In some embodiments, the signal CKIB generated at the output terminal (e.g., node N1) of the inverter INV1 is an inverted version of the input clock signal CKI with one inverter delay. Similarly, the signal VN3 generated at the output terminal (e.g., node N3) of the inverter INV2 is also an inverted version of the input clock signal CKI with one inverter delay. The signal CKIB is inverted by the inverter INV3, and the signal VN2 is an inverted version of the signal CKIB with one inverter delay, which is substantially equal to the input clock signal CKI with two inverter delays. The signal VN2 is inverted by the inverter INV4, and the second output clock signal CKOUTB is an inverted version of the signal VN2 with one inverter delay. Furthermore, the signal VN3 is transmitted to the input terminal of the buffer circuit BUF3. It should be noted that the output signal of the inverter INV4 can be regarded as the signal CKIB with two inverter delays (e.g., INV3 and INV4), while the output signal of the buffer circuit BUF3 can be regarded as the signal CKIB with one buffer delay (e.g., BUF3). In addition, the output terminals of the buffer circuit BUF3 and the inverter INV4 are connected to node N4, enabling the buffer circuit BUF3 to increase the driving capability of the inverter INV4.

Figure 2C:
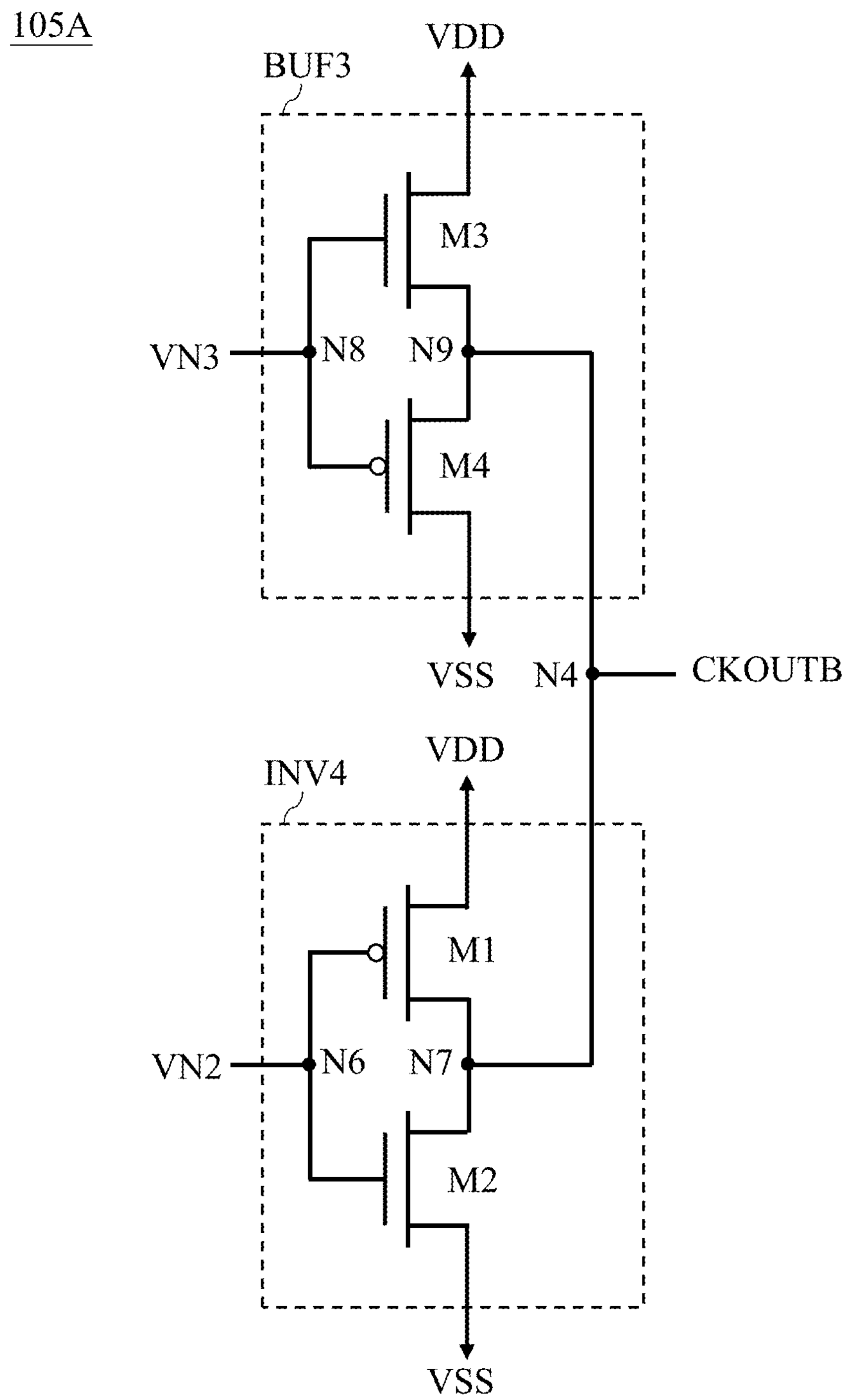
FIG. 2C is a partial circuit diagram of the single-to-differential (S2D) circuit in FIG. 1.

FIG. 2C is a partial circuit diagram of the S2D circuit in FIG. 1. The output stage 105A of the second output clock signal CKOUTB is shown in FIG. 2C, which includes the buffer circuit BUF3 and the inverter INV4. As depicted in FIG. 2C, the output terminal (e.g., node N9) of the buffer circuit BUF3 and the output terminal (e.g., node N7) of the inverter INV4 are connected to node N4. It should be noted that the input signals for the buffer circuit BUF3 and the inverter INV4 are the signals VN3 and VN2, respectively. Additionally, the signal VN3 is substantially complementary to the signal VN2. For example, when the signal VN2 is in the high logic state (e.g., "1"), the signal VN3 is in the low logic state (e.g., "0"). Similarly, when the signal VN2 is in the low logic state (e.g., "0"), the signal VN3 is in the high logic state (e.g., "1").

In some embodiments, when the signals VN2 and VN3 are respectively in the low logic state (e.g., "0") and high logic state (e.g., "1"), transistors M1 and M3 are turned on, and transistors M2 and M4 are turned off. At this time, the voltage at node N4 (i.e., CKOUTB) is pulled up from the reference voltage VSS through both transistors M1 and M3. It should be noted that the buffer circuit BUF3 can improve the driving capability within the voltage pull-up duration while the voltage at node N4 (i.e., CKOUTB) is lower than VDD-Vtn. Upon the voltage at node N4 (i.e., CKOUTB) reaching VDD-Vtn, the voltage at node N4 can be further pulled up to the power supply voltage VDD through transistor M1. Conversely, when the signals VN2 and VN3 are respectively in the high logic state (e.g., "1") and low logic state (e.g., "0"), transistors M2 and M4 are turned on, and transistors M1 and M3 are turned off. At this time, the voltage at node N5 (i.e., CKOUTB) is pulled down from the power supply voltage VDD through both transistors M2 and M4. It should be noted that the buffer circuit BUF3 can improve the driving capability within the voltage pull-down duration while the voltage at node N4 (i.e., CKOUTB) is higher than VSS+|Vtp|. Upon the voltage at node N4 (i.e., CKOUTB) reaching VSS+|Vtp|, the voltage at node N4 can be further pulled down to the reference voltage VSS through transistor M2. Therefore, with the assistance of the buffer circuit BUF3, both the rising time and falling time of the second output clock signal CKOUTB can be further reduced.

Figure 2D:
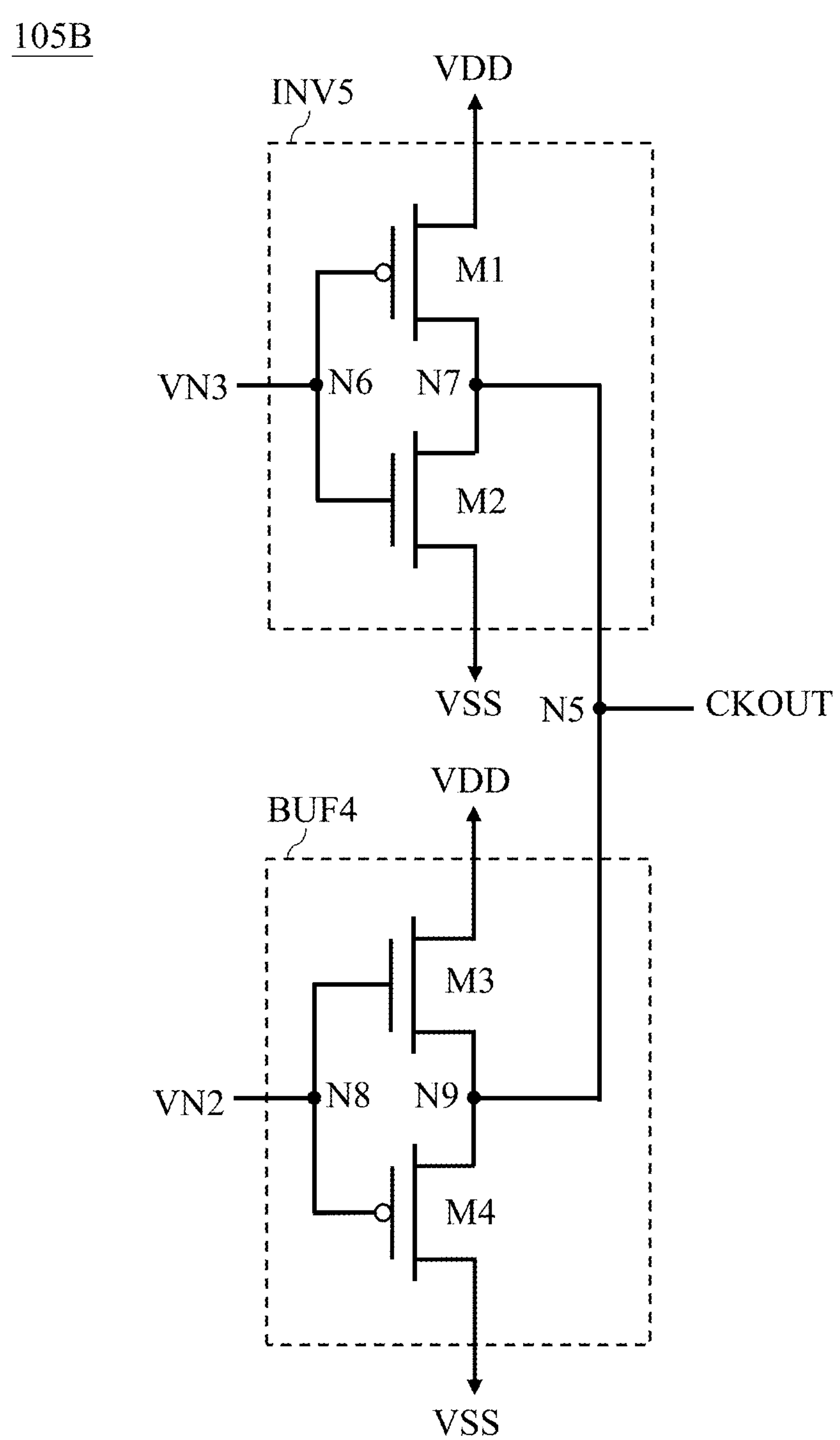
FIG. 2D is another partial circuit diagram of the S2D circuit in FIG. 1.

FIG. 2D is another partial circuit diagram of the S2D circuit in FIG. 1. The output stage 105B of the first output clock signal CKOUT is shown in FIG. 2D, which includes the buffer circuit BUF4 and the inverter INV5. As depicted in FIG. 2D, the output terminal (e.g., node N9) of the buffer circuit BUF4 and the output terminal (e.g., node N7) of the inverter INV5 are connected to node N5. It should be noted that the input signals for the buffer circuit BUF4 and the inverter INV5 are the signals VN2 and VN3, respectively. Additionally, the signal VN3 is substantially complementary to the signal VN2. For example, when the signal VN2 is in the high logic state (e.g., “1”), the signal VN3 is in the low logic state (e.g., “0”). Similarly, when the signal VN2 is in the low logic state (e.g., “0”), the signal VN3 is in the high logic state (e.g., “1”).

In some embodiments, the duty cycle offset DCO between the first output clock signal CKOUT and the second output clock signal CKOUTB can be calculated as: DCO=100%−Duty Cycle of in-phase clock signal (i.e., CKOUT)−Duty Cycle of out-phase clock signal (i.e., CKOUTB). In some embodiments, let ΔT1 denotes the difference between t1 to t2, and ΔT2 denotes the difference between t3 to t4, where t1 denotes the time interval the in-phase clock signal (i.e., CKOUT) increases from the reference voltage VSS to half the power supply voltage (i.e., VDD/2), t2 denotes the time interval the out-phase clock signal (i.e., CKOUTB) decreases from the power supply voltage VDD to half the power supply voltage (i.e., VDD/2), t3 denotes the time interval the in-phase clock signal decreases from the power supply voltage VDD to half the power supply voltage (i.e., VDD/2), and t4 denotes the time interval the out-phase clock signal increases from the reference voltage VSS to half the power supply voltage (i.e., VDD/2). The skew between the in-phase clock signal and the out-phase clock signal can be calculated as: skew=max(|T1|−|T2|).

Figure 3:
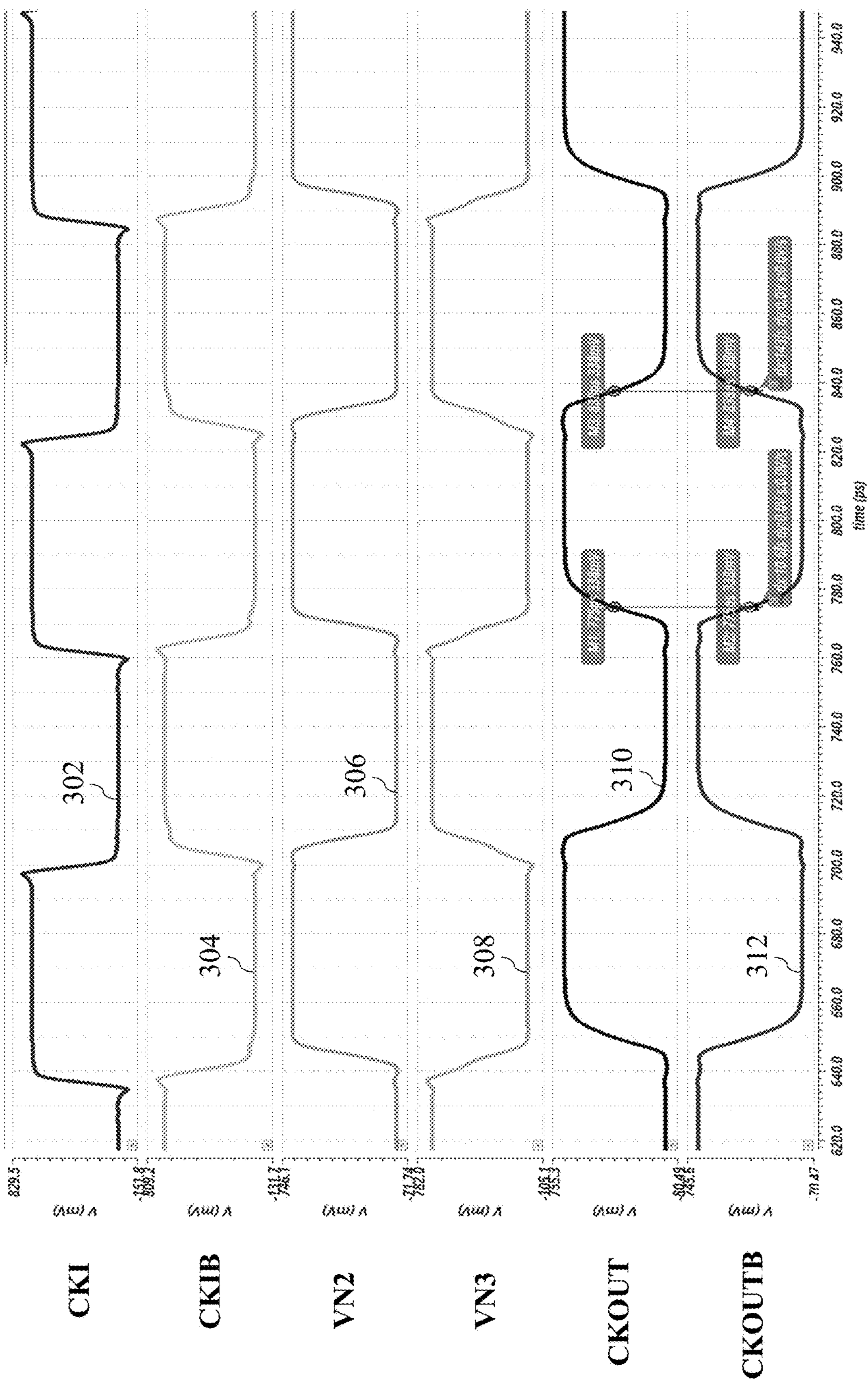
FIG. 3 is a waveform diagram of various signals within the S2D circuit of FIG. 1.

FIG. 3 is a waveform diagram of various signals within the S2D circuit of FIG. 1. Please refer to both FIG. 1, FIGS. 2C-2D, and FIG. 3.

In some embodiments, the waveforms of the signals CKI, CKIB, VN2, VN3, CKOUT, and CKOUTB within the S2D circuit 100A in FIG. 1 are shown by curves 302, 304, 306, 308, 310, and 312 in FIG. 3, respectively. When the signals VN2 and VN3 are respectively in the high logic state (e.g., “1”) and low logic state (e.g., “0”), transistors M1 and M3 are turned on, and transistors M2 and M4 are turned off. At this time, the voltage at node N5 (i.e., CKOUT) is pulled up from the reference voltage VSS through both transistors M1 and M3. It should be noted that the buffer circuit BUF4 can improve the driving capability within the voltage pull-up duration while the voltage at node N5 (i.e., CKOUT) is lower than VDD-Vtn. Upon the voltage at node N5 (i.e., CKOUT) reaching VDD-Vtn, the voltage at node N5 can be further pulled up to the power supply voltage VDD through transistor M1. Conversely, when the signals VN2 and VN3 are respectively in the low logic state (e.g., “0”) and high logic state (e.g., “1”), transistors M2 and M4 are turned on, and transistors M1 and M3 are turned off. At this time, the voltage at node N5 (i.e., CKOUT) is pulled down from the power supply voltage VDD through both transistors M2 and M4. It should be noted that the buffer circuit BUF4 can improve the driving capability within the voltage pull-down duration while the voltage at node N5 (i.e., CKOUT) is higher than VSS+|Vtp|. Upon the voltage at node N5 (i.e., CKOUT) reaching VSS+|Vtp|, the voltage at node N5 can be further pulled down to the reference voltage VSS through transistor M2. Therefore, with the assistance of the buffer circuit BUF4, both the rising time and falling time of the second output clock signal CKOUT can be further reduced.

In some embodiments, the subcircuit for improving the driving capability of the output voltage signal of an inverter using a buffer circuit as described above can also be applied to an inverter in combination with a buffer circuit, such as inverter INV2 plus buffer circuit BUF2, and inverter INV3 plus buffer circuit BUF1. Specifically, the rising time and falling time of the signals VN2 and VN3 can be reduced using the proposed subcircuit, leading to a smaller skew and a smaller duty cycle offset between signals VN2 and VN3. Additionally, with the output stages 105A-105B of the first output clock signal CKOUT and the second output clock signal CKOUTB, the rising time and falling time of the first output clock signal CKOUT and the second output clock signal CKOUTB can be further reduced, further reducing the skew and duty cycle offset between the first output clock signal CKOUT and the second output clock signal CKOUTB. For example, as shown in FIG. 3, the first output clock signal CKOUT takes approximately 775 ps to increase from the reference voltage VSS to half the power supply voltage VDD/2, while the second output clock signal CKOUB takes approximately 775 ps to decrease from the power supply voltage VDD to half the power supply voltage VDD/2, resulting in the time difference therebetween (i.e., ΔT1) is approximately 10.6 fs. Similarly, the first output clock signal CKOUT takes approximately 838 ps to decrease from the power supply voltage VDD to half the power supply voltage VDD/2, while the second output clock signal CKOUB takes approximately 838 ps to decrease from the power supply voltage VDD to half the power supply voltage VDD/2, resulting in the time difference therebetween (i.e., ΔT2) is approximately 143 fs. Accordingly, the skew between the first output clock signal CKOUT and the second output clock signal CKOUTB can be calculated as max (10.6 fs, 143 fs)=143 fs. Additionally, the duty cycle offset between the first output clock signal CKOUT and the second output clock signal CKOUB can be further reduced, indicating the first output clock signal CKOUT and the second output clock signal CKOUB are substantially aligned. Additionally, the S2D circuit 100A is further capable of reducing the corrected duty cycle accuracy, deterministic jitter, and random jitter. Therefore, the accuracy of the first output clock signal CKOUT and the second output clock signal CKOUTB generated by the S2D circuit 100A is improved and becomes more feasible for high-speed applications, such as operating in dozens of GHz or above.

It should be noted that, in some approaches, the S2D circuit may include one or more CMOS (complementary metal oxide semiconductor) transmission gates, each including a P-type transistor and an N-type transistor. However, the P-type transistor has a lower driving capability compared to the N-type transistor of the same size, and thus the P-type transistor is designed to have a larger size than the N-type transistor, resulting in asymmetric layout of the CMOS transmission gate and the overall layout of the S2D circuit.

This can complicate the routing paths within the S2D circuit and increase the overall layout size.

It should be noted that the schematic diagram of the S2D circuit 100A shown in FIG. 1 is symmetric with respect to line 102. For example, the upper portion 103A and the lower portion 103B of the S2D circuit 100A are symmetric with respect to line 102, while the inverter INV1 may be evenly disposed across the upper portion 103A and lower portion 103B. In some embodiments, the inverters INV6 and INV7 may be evenly disposed across the upper portion 103A and the lower portion 103B. In some embodiments, one of the inverters INV6 and INV7 may be disposed within the upper portion 103A, while the other of the inverters INV6 and INV7 may be disposed within the lower portion 103B.

Additionally, although not explicitly shown in the figures, the layout of each buffer circuit BUF1 to BUF4 (e.g., shown by buffer circuit 120 in FIG. 2B) may be similar to that of each inverter INV1 to INV7 (e.g., shown by inverter 110 in FIG. 2A) in dimension and shape, making the layout of the S2D circuit 100A symmetric (e.g., with respect to line 102) and facilitating the routing between the buffer circuits BUF1 to BUF4 and inverter circuits INV1 to INV7. Therefore, the proposed symmetric circuit design of the S2D circuit 100A can significantly reduce the overall layout size while improving the accuracy of the output differential clock signals.

Figure 4B:
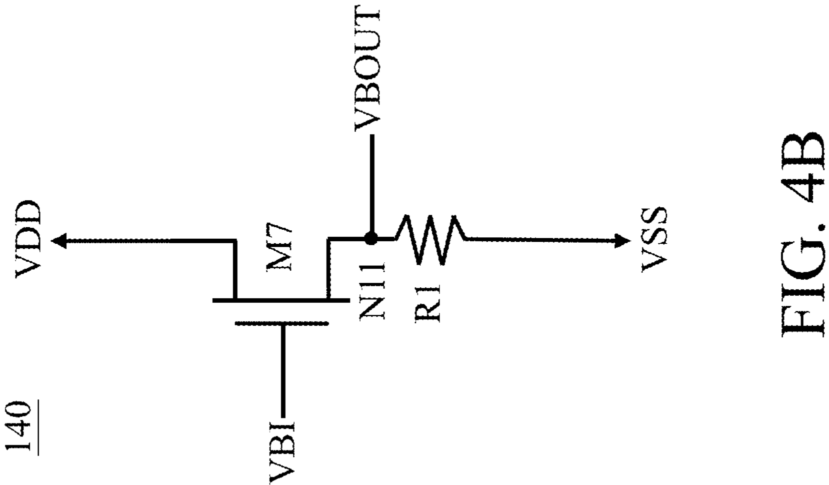
FIG. 4B is yet another circuit diagram of the buffer circuit in FIG. 1.
Figure 4A:
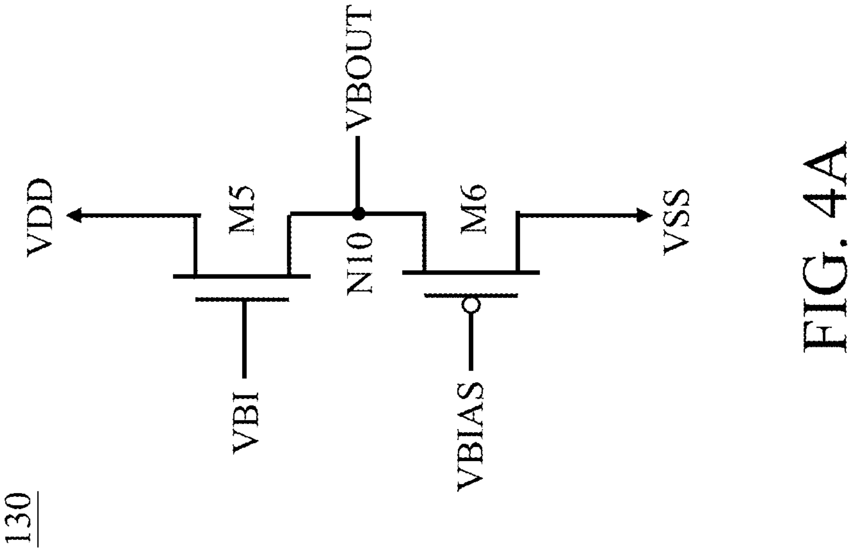
FIG. 4A is another circuit diagram of the buffer circuit in FIG. 1.

FIG. 4A is another circuit diagram of the buffer circuit in FIG. 1. In some embodiments, each of the buffer circuits BUF1 to BUF4 shown in FIG. 1 may be implemented using a source-follower buffer 130 (or simply referred to as a buffer circuit 130) shown in FIG. 4A. As depicted in FIG. 4A, the buffer circuit 120 includes transistors M5 and M6. The transistor M5, such as a N-type transistor, includes a gate terminal receiving the input voltage signal VBI, a drain terminal coupled to the power supply voltage VDD, and a source terminal coupled to the output terminal (e.g., node N10) of the buffer circuit 130, while the transistor M6, such as a P-type transistor, includes a gate terminal receiving a bias voltage signal VBIAS (e.g., an adjustable voltage to turn on or turn off transistor M6), a drain terminal coupled to the reference voltage VSS, and a source terminal connected to the output terminal (e.g., node N10) of the buffer circuit 130. When both the input voltage signal VBI and the bias voltage signal VBIAS are in the high logic state (e.g., “1”), transistor M5 is turned on, and transistor M6 is turned off, pulling up the output voltage VBOUT at node N10 to the voltage of VDD-Vtn, where Vtn denotes the threshold voltage of transistor M5, which is a positive voltage. When both the input voltage signal VBI and the bias voltage signal VBIAS are in the low logic state (e.g., “0”), transistor M6 is turned on, and transistor M5 is turned off, pulling down the output voltage VBOUT at node N10 to the voltage of (VSS+|Vtp|), where Vtp denotes the threshold voltage of transistor M6, which is a negative voltage. It should be noted that the voltage swing range of the output voltage VBOUT at node N10 is between the (VDD-Vtn) and (VSS+|Vtp|). Accordingly, the logic state of the output voltage signal VBOUT follows that of the input voltage signal VBI.

The buffer circuit 130 shown in FIG. 4A can also be used to improve the driving capability of the output voltage of the inverters INV2 to INV7 in a manner similar to that of the buffer circuit 120 shown in FIG. 2B, and thus the details thereof are not repeated here.

FIG. 4B is yet another circuit diagram of the buffer circuit in FIG. 1. In some embodiments, each of the buffer circuits BUF1 to BUF4 shown in FIG. 1 may be implemented using a source-follower buffer 140 (or simply referred to as a buffer circuit 140) shown in FIG. 4B. As depicted in FIG. 4B, the buffer circuit 130 includes a transistor M7 and a resistor R1. The transistor M7, such as a N-type transistor, includes a gate terminal receiving the input voltage signal VBI, a drain terminal coupled to the power supply voltage VDD, and a source terminal coupled to the output terminal (e.g., node N11) of the buffer circuit 140. In some embodiments, the resistor R1 is a passive element that can be fabricated at the back end of line (BEOL). Alternatively, the resistor R1 can be implemented using a transistor in an appropriate configuration. When the input voltage signal VBI is in the high logic state (e.g., “1”), transistor M7 is turned on, pulling up the output voltage VBOUT at node N11 to the voltage of VDD-Vtn through transistor M7, where Vtn denotes the threshold voltage of transistor M7, which is a positive voltage. When the input voltage signal VBI is in the low logic state (e.g., “0”), transistor M7 is turned off, pulling down the output voltage VOUT at node N11 to the reference voltage VSS through resistor R1. It should be noted that the voltage swing range of the output voltage VBOUT at node N10 is between the (VDD-Vtn) and the reference voltage VSS. Accordingly, the logic state of the output voltage signal VBOUT follows that of the input voltage signal VBI.

The buffer circuit 140 shown in FIG. 4B can also be used to improve the driving capability of the output voltage of the inverters INV2 to INV7 in a manner similar to that of the buffer circuit 120 shown in FIG. 2B, and thus the details thereof are not repeated here.

Figure 5:
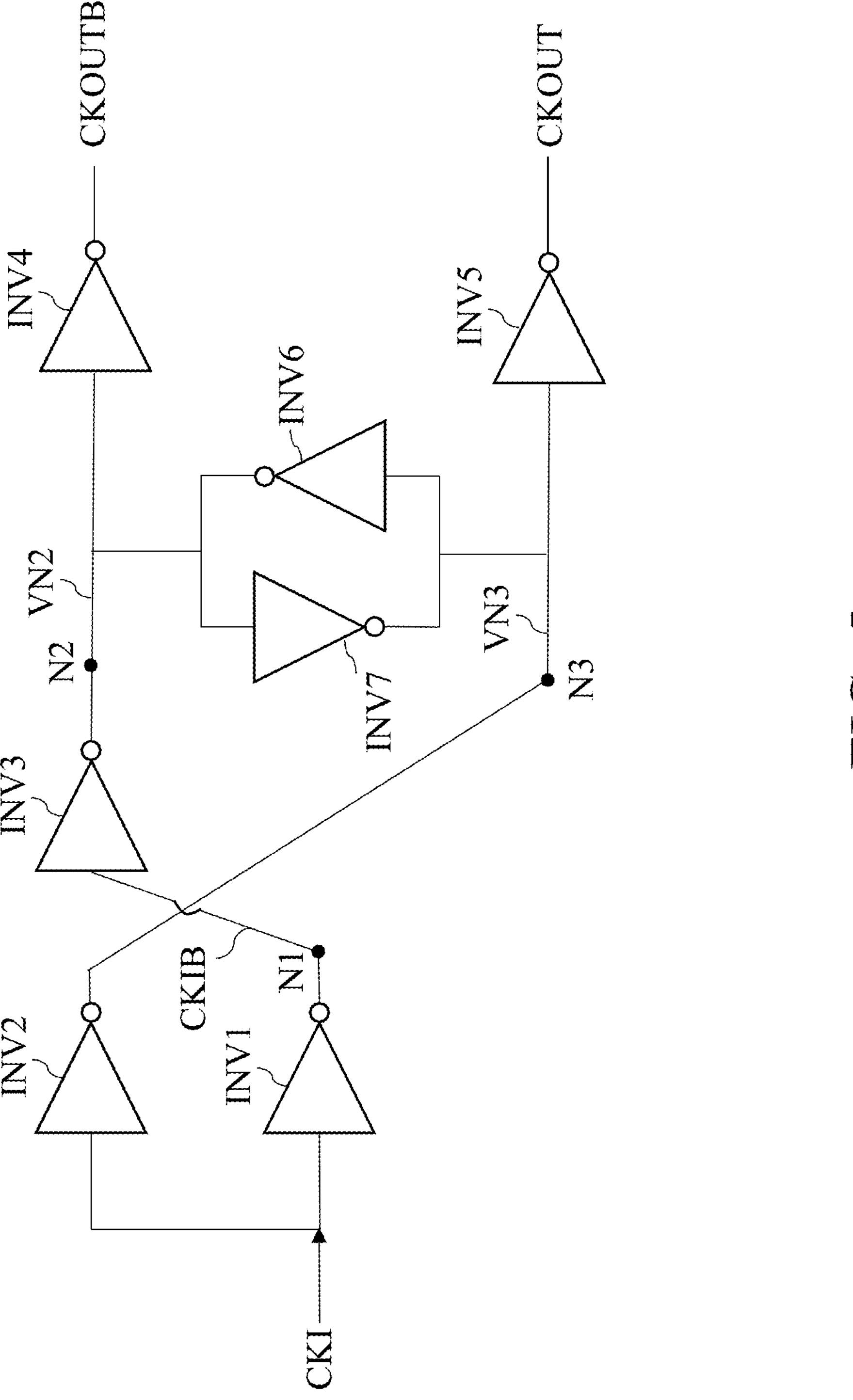
FIG. 5 is a block diagram of an S2D circuit in accordance with a comparative embodiment of the present disclosure.
Figure 6:
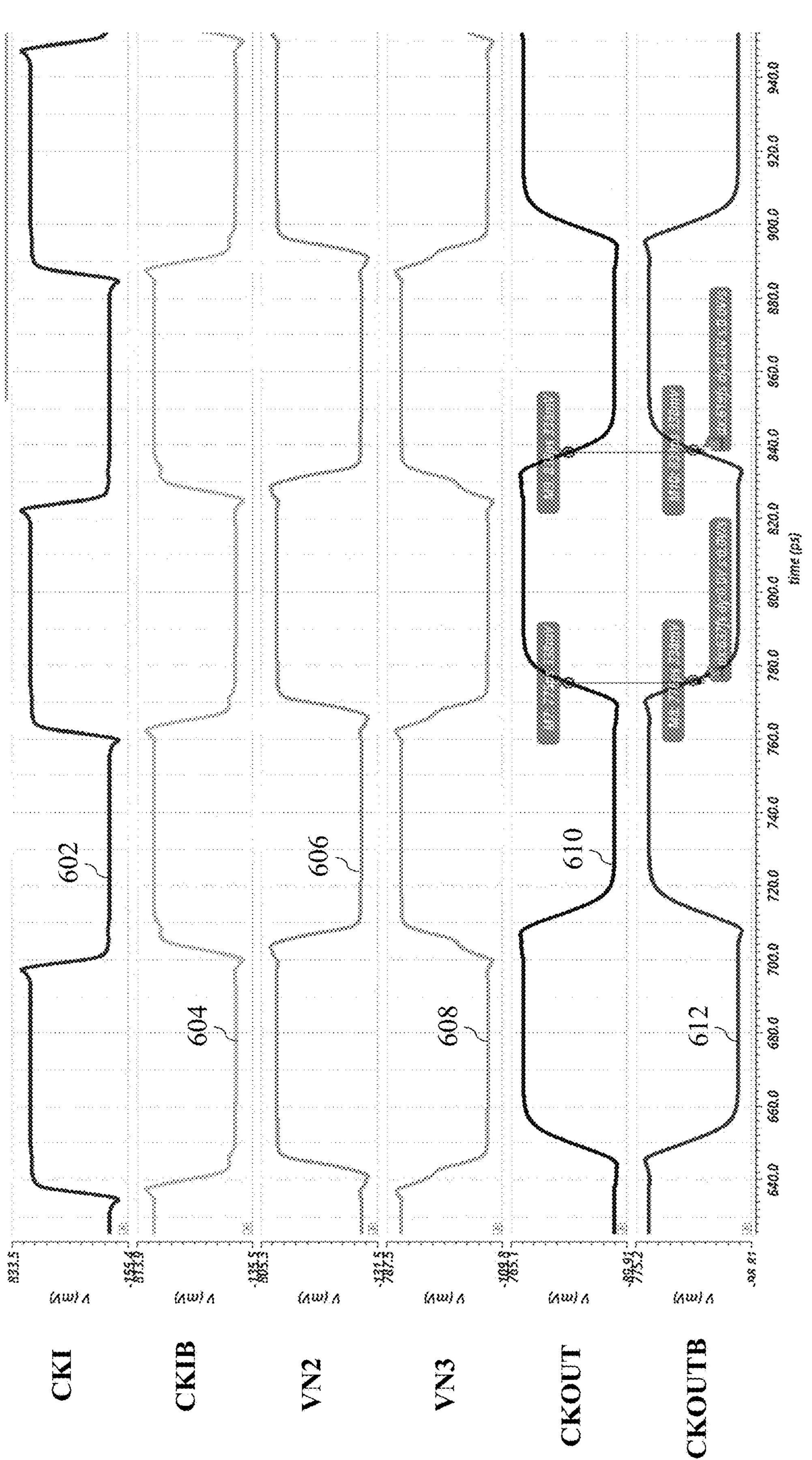
FIG. 6 is a waveform diagram of various signals within the S2D circuit in FIG. 5.

FIG. 5 is a block diagram of an S2D circuit in accordance with a comparative embodiment of the present disclosure. FIG. 6 is a waveform diagram of various signals within the S2D circuit in FIG. 5. Please refer to both FIG. 5 and FIG. 6.

In some embodiments, the S2D circuit 100B shown in FIG. 5 may be similar to the S2D circuit 100A shown in FIG. 1, with the difference being that the S2D circuit 100B shown in FIG. 5 does not include buffer circuits BUF1 to BUF4 shown in FIG. 1. In other words, for the S2D circuit 100B, the function of converting a single-ended input signal to a differential output signal can be maintained without using the buffer circuits BUF1 to BUF4. Additionally, each of the inverters INV1 to INV7 can be implemented using the inverter 110 shown in FIG. 2A. For example, the input clock signal CKI is provided to the input terminals of the inverters INV1 and INV2. The output terminal (e.g., node N3) of the inverter INV2 is connected to the input terminals of the inverters INV5 and INV6. Additionally, the output terminal (e.g., node N2) of the buffer circuit BUF1 is connected to the output terminal of the inverter INV3 and the input terminals of the inverter INV4 and the buffer circuit BUF4. The inverters INV6 and INV7 may form a latch which is coupled between nodes N2 and N3. Furthermore, the inverter INV5 outputs the first output clock signal CKOUT at its output terminal, while the inverter INV4 outputs the second output clock signal CKOUTB at its output terminal.

In some embodiments, the signal CKIB generated at the output terminal (e.g., node N1) of the inverter INV1 is an inverted version of the input clock signal CKI with one inverter delay. Similarly, the signal VN3 generated at the output terminal (e.g., node N3) of the inverter INV1 is also an inverted version of the input clock signal CKI with one inverter delay. The signal CKIB is inverted by the inverter INV3, and the signal VN2 is an inverted version of the signal CKIB with one inverter delay, which is substantially equal to the input clock signal CKI with two inverter delays. The signal VN2 is inverted by the inverter INV4, and the second output clock signal CKOUTB is an inverted version of the signal VN2 with one inverter delay. It should be noted that the output signal (i.e., CKOUTB) of the inverter INV4 can be regarded as the signal CKIB with two inverter delays (e.g., INV3 and INV4), while the output signal (i.e., CKOUT) of the inverter INV5 can be regarded as an inverted version of the signal CKIB with one inverter delay.

Referring to FIG. 6, in some embodiments, the waveforms of the signals CKI, CKIB, VN2, VN3, CKOUT, and CKOUTB within the S2D circuit 100B in FIG. 5 are shown by curves 602, 604, 606, 608, 610, and 612 in FIG. 6, respectively. The output stage of the first output clock signal CKOUT includes the inverter INV5, while the output stage of the second output clock signal CKOUTB includes the inverter INV4. In other words, the rising time and falling time of the first output clock signal CKOUT depend on the driving capability of the P-type transistor and N-type transistor within the inverter INV5, while the rising time and falling time of the second output clock signal CKOUTB depend on the driving capability of the P-type transistor and N-type transistor within the inverter INV4. For example, as shown in FIG. 6, the first output clock signal CKOUT takes approximately 775 ps to increase from the reference voltage VSS to half (e.g., 50%) the power supply voltage VDD/2, while the second output clock signal CKOUB takes approximately 776 ps to decrease from the power supply voltage VDD to half the power supply voltage VDD/2, resulting in the time difference therebetween (i.e., ΔT1) is approximately 637 fs. Similarly, the first output clock signal CKOUT takes approximately 838 ps to decrease from the power supply voltage VDD to half the power supply voltage VDD/2, while the second output clock signal CKOUB takes approximately 839 ps to decrease from the power supply voltage VDD to half the power supply voltage VDD/2, resulting in the time difference therebetween (i.e., ΔT2) is approximately 619 fs. Accordingly, the skew between the first output clock signal CKOUT and the second output clock signal CKOUTB can be calculated as max (637 fs, 619 fs)=637 fs, which is longer than the skew (e.g., approximately 143 fs) between the first output clock signal CKOUT and the second output clock signal CKOUTB shown in FIG. 3.

Figure 7:
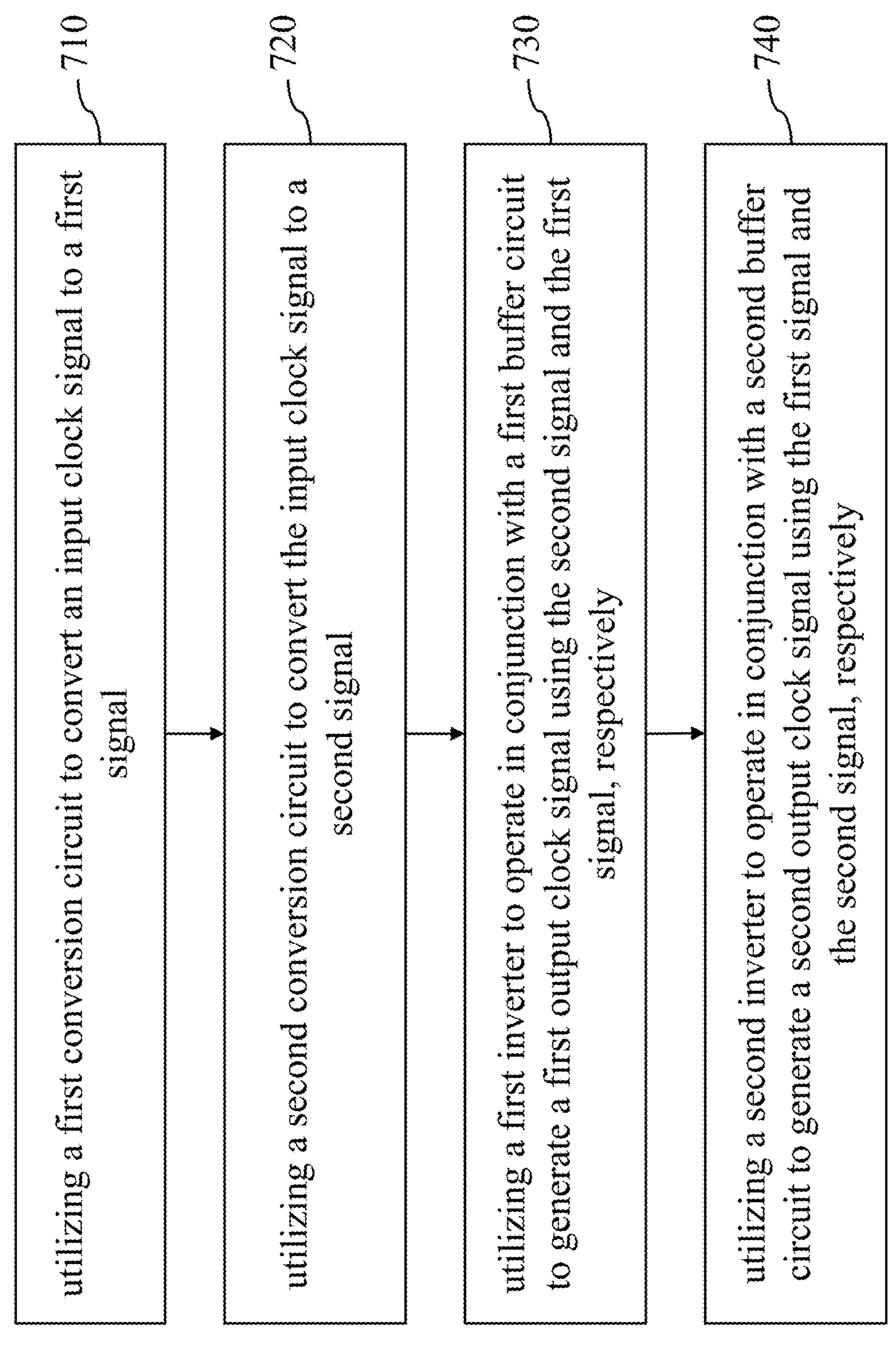
FIG. 7 is a flowchart of a method for operating a single-to-differential circuit in accordance with some embodiments of the present disclosure.

FIG. 7 is a flowchart 700 of a method for operating a single-to-differential circuit in accordance with some embodiments of the present disclosure. Please refer to FIG. 1 and FIG. 7. The flowchart 700 includes operations 710, 720, 730, and 740. It is possible that the flowchart 700 may include additional interleaving operations added before or after each of the operations 710, 720, 730, and 740.

At operation 710, a first conversion circuit is utilized to convert an input clock signal CKI to a first signal (e.g., VN2). For example, the first conversion circuit may include inverters INV1 and INV3 shown in FIG. 1, and the input clock signal CKI is inverted twice by inverters INV1 and INV3 to generate the first signal VN2 at node N2.

At operation 720, a second conversion circuit is utilized to convert the input clock signal CKI to a second signal (e.g., VN3). For example, the second conversion circuit may include inverter INV2 shown in FIG. 1, and the input clock signal CKI is inverted once by inverter INV2 to generate the second signal VN3 at node N3.

At operation 730, a first inverter is utilized to operate in conjunction with a first buffer circuit to generate a first output clock signal (e.g., CKOUT) using the second signal and the first signal, respectively. The first inverter and the first buffer circuit may be the inverter INV5 and buffer circuit BUF4 shown in FIG. 1, which receives the second signal (e.g., VN3) and the first signal (e.g., VN2), respectively.

At operation 740, a second inverter is utilized to operate in conjunction with a second buffer circuit to generate a second output clock signal (e.g., CKOUTB) using the first signal and the second signal, respectively. The second inverter and the second buffer circuit may be the inverter INV4 and buffer circuit BUF3 shown in FIG. 1, which receives the first signal (e.g., VN2) and the second signal (e.g., VN3), respectively. Additionally, the first output clock signal CKOUT and the second output clock signal CKOUTB constitute a differential clock signal.

An aspect of the present disclosure provides an integrated circuit, which includes an input stage, a first output stage, and a second output stage. The input stage is configured to receive an input clock signal, and convert the input clock signal into a first signal and a second signal. The first output stage includes a first inverter and a first buffer circuit coupled to a first output terminal of the integrated circuit. The first inverter and the first buffer circuit receive the second signal and the first signal, respectively, and generate a first output clock signal at the first output terminal. The second output stage includes a second inverter and a second buffer circuit coupled to a second output terminal of the integrated circuit. The second inverter and the second buffer circuit receive the first signal and the second signal, respectively, and generate a second output clock signal at the second output terminal. The first output clock signal and the second output clock signal are differential clock signals.

Another aspect of the present disclosure provides an integrated circuit, which includes a first inverter stage, a second inverter stage, a first output stage, and a second output stage. The first inverter stage is configured to convert an input clock signal into a first signal. The second inverter stage is configured to convert the input clock signal to a second signal. The first output stage includes a first inverter and a first buffer circuit coupled to a first output terminal. The first inverter and the first buffer circuit receive the second signal and the first signal, respectively, and generate a first output clock signal at the first output terminal. The second output stage includes a second inverter and a second buffer circuit coupled to a second output terminal. The second inverter and the second buffer circuit receive the first signal and the second signal, respectively, and generate a second output clock signal at the second output terminal. The first output clock signal and the second output clock signal constitute a differential clock signal.

Yet another aspect of the present disclosure provides a method, which includes the following steps: utilizing a first conversion circuit to convert an input clock signal to a first signal; utilizing a second conversion circuit to convert the input clock signal to a second signal; utilizing a first inverter to operate in conjunction with a first buffer circuit to generate a first output clock signal using the second signal and the first signal, respectively; and utilizing a second inverter to operate in conjunction with a second buffer circuit to generate a second output clock signal using the first signal and the second signal, respectively. The first output clock signal and the second output clock signal are differential clock signals.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope processes, machines, manufacture, compositions of matter, means, methods or steps. In addition, each claim constitutes a separate embodiment, and the combination of various claims and embodiments are within the scope of the present disclosure.

What is claimed is:

1. An integrated circuit, comprising:

an input stage, configured to receive an input clock signal, and convert the input clock signal into a first signal and a second signal;

a first output stage, comprising: a first inverter and a first buffer circuit coupled to a first output terminal of the integrated circuit, wherein the first inverter and the first buffer circuit receive the second signal and the first signal, respectively, and generate a first output clock signal at the first output terminal; and a second output stage, comprising a second inverter and a second buffer circuit coupled to a second output terminal of the integrated circuit, wherein the second inverter and the second buffer circuit receive the first signal and the second signal, respectively, and generate a second output clock signal at the second output terminal, wherein the first output clock signal and the second output clock signal are differential clock signals, wherein the input stage comprises:

a third inverter, configured to convert the input clock signal to generate a third signal at a first node;

a fourth inverter, configured to convert the input clock signal to generate the second signal at a second node;

a fifth inverter, configured to convert the third signal to generate the first signal at a third node;

a third buffer circuit, coupled between the input clock signal and the first node; and a fourth buffer circuit, coupled between the first node and the second node.

2. The integrated circuit of claim 1, wherein the first output clock signal and the second output clock signal are an in-phase clock signal and an out-phase clock signal with respect to the input clock signal.

3. The integrated circuit of claim 1, wherein the first output clock signal substantially aligns with the second output clock signal.

4. The integrated circuit of claim 1, wherein the first buffer circuit and the second buffer circuit are configured to increase driving capabilities of the first inverter and the second inverter, respectively.

5. The integrated circuit of claim 4, wherein the first buffer circuit and the second buffer circuit comprise logic buffers.

6. The integrated circuit of claim 5, wherein a layout of each of the first buffer circuit and the second buffer circuit is symmetric to that of each of the first inverter and the second inverter.

7. The integrated circuit of claim 6, wherein each of the first inverter and the second inverter comprises:

a first P-type transistor, comprising a gate terminal receiving a first input signal, a drain terminal connected to a third output terminal, and a source terminal connected to a power supply voltage; and a first N-type transistor, comprising a gate terminal receiving the first input signal, a drain terminal connected to the third output terminal, and a source terminal connected to a reference voltage.

8. The integrated circuit of claim 7, wherein each logic buffer comprises:

a second P-type transistor, comprising a gate terminal receiving a second input signal, a drain terminal connected to the reference voltage, and a source terminal connected to a fourth output terminal; and a second N-type transistor, comprising a gate terminal receiving the second input signal, a drain terminal connected to the power supply voltage, and a source terminal connected to the fourth output terminal.

9. The integrated circuit of claim 1, further comprising: a latch coupled between the second node and the third node.

10. An integrated circuit, comprising:

a first inverter stage, configured to convert an input clock signal into a first signal;

a second inverter stage, configured to convert the input clock signal to a second signal;

a first output stage, comprising: a first inverter and a first buffer circuit coupled to a first output terminal, wherein the first inverter and the first buffer circuit receive the second signal and the first signal, respectively, and generate a first output clock signal at the first output terminal; and a second output stage, comprising a second inverter and a second buffer circuit coupled to a second output terminal, wherein the second inverter and the second buffer circuit receive the first signal and the second signal, respectively, and generate a second output clock signal at the second output terminal, wherein the first output clock signal and the second output clock signal constitute a differential clock signal, wherein the first inverter stage comprises a third inverter and a fourth inverter connected in series through a first node, and the fourth inverter is connected to the second inverter at a second node, wherein the second inverter stage comprises a fifth inverter, which is connected to the first inverter at a third node.

11. The integrated circuit of claim 10, wherein the first output clock signal and the second output clock signal are an in-phase clock signal and an out-phase clock signal with respect to the input clock signal.

12. The integrated circuit of claim 10, wherein the first buffer circuit and the second buffer circuit comprise logic buffers.

13. The integrated circuit of claim 12, wherein a layout of each of the first buffer circuit and the second buffer circuit is symmetric to that of each of the first inverter and the second inverter.

14. The integrated circuit of claim 10, further comprising:

a third buffer circuit, coupled between the input clock signal and the second node; and a fourth buffer circuit, coupled between the first node and the third node.

15. The integrated circuit of claim 10, wherein the first output clock signal substantially aligns with the second output clock signal.

16. The integrated circuit of claim 10, wherein the first buffer circuit and the second buffer circuit are configured to increase driving capabilities of the first inverter and the second inverter, respectively.

17. A method, comprising:

utilizing a first conversion circuit to convert an input clock signal to a first signal;

utilizing a second conversion circuit to convert the input clock signal to a second signal;

utilizing a first inverter to operate in conjunction with a first buffer circuit to generate a first output clock signal using the second signal and the first signal, respectively; and utilizing a second inverter to operate in conjunction with a second buffer circuit to generate a second output clock signal using the first signal and the second signal, respectively, wherein the first output clock signal and the second output clock signal are differential clock signals, wherein the first conversion circuit comprises a third inverter and a fourth inverter connected in series through a first node, and the fourth inverter is connected to the second inverter at a second node, wherein the second conversion unit comprises a fifth inverter, which is connected to the first inverter at a third node.

18. The method of claim 17, wherein the first buffer circuit and the second buffer circuit comprise logic buffers.

19. The method of claim 17, wherein the first output clock signal substantially aligns with the second output clock signal.

20. The method of claim 17, wherein the first buffer circuit and the second buffer circuit are configured to increase driving capabilities of the first inverter and the second inverter, respectively.

* * * * *